(12) United States Patent
Chong et al.

(10) Patent No.: US 11,079,253 B2
(45) Date of Patent: Aug. 3, 2021

(54) WIEGAND MODULE AND METHODS OF FORMING THE SAME

(71) Applicant: Avago Technologies International Sales PTE, Limited, Singapore (SG)

(72) Inventors: Choon Aun Chong, Bayan Lepas (MY); Weng Fei Wong, Bayan Lepas (MY); Yik Foong Soo, Bayan Lepas (MY)

(73) Assignee: Avago Technologies International Sales Pte. Limited, Singapore (SG)

( * ) Notice: Subject to any disclaimer, the term of this patent is extended or adjusted under 35 U.S.C. 154(b) by 299 days.

(21) Appl. No.: 15/953,977

(22) Filed: Apr. 16, 2018

(65) Prior Publication Data
US 2019/0316934 A1    Oct. 17, 2019

(51) Int. Cl.
| | |
|---|---|
| *G01D 5/14* | (2006.01) |
| *H01F 27/28* | (2006.01) |
| *H01F 27/40* | (2006.01) |
| *H05K 1/18* | (2006.01) |
| *H01F 27/24* | (2006.01) |
| *H05K 1/11* | (2006.01) |

(52) U.S. Cl.
CPC ............... *G01D 5/14* (2013.01); *H01F 27/24* (2013.01); *H01F 27/28* (2013.01); *H01F 27/40* (2013.01); *H05K 1/111* (2013.01); *H05K 1/181* (2013.01); *H05K 2201/10151* (2013.01)

(58) Field of Classification Search
CPC ........ G01D 5/145; G01D 5/14; G01P 3/4815; H01F 17/045; H01F 27/24; H01F 27/28; H01F 27/2828; H01F 27/29; H01F 227/40; H01F 27/30; H01F 27/263; H05K 1/111; H05K 1/181; H05K 2201/10151; H05K 1/11; H05K 1/18
See application file for complete search history.

(56) References Cited

U.S. PATENT DOCUMENTS

| | | | | |
|---|---|---|---|---|
| 3,014,190 | A * | 12/1961 | Sutton, Jr. | H01F 21/02 336/92 |
| 4,364,013 | A * | 12/1982 | Castera | G01R 33/02 324/207.13 |
| 4,944,270 | A * | 7/1990 | Matsushita | G01R 33/04 29/602.1 |
| 5,226,220 | A * | 7/1993 | Gevas | H01F 41/005 264/272.19 |
| 7,598,733 | B2 | 10/2009 | Mehnert et al. | |
| 2011/0306219 | A1 * | 12/2011 | Swanger | H05K 3/325 439/55 |
| 2014/0067301 | A1 * | 3/2014 | Mehnert | G01P 3/4815 702/78 |
| 2019/0148043 | A1 * | 5/2019 | Theil | H01F 41/06 336/222 |

* cited by examiner

*Primary Examiner* — Melissa J Koval
*Assistant Examiner* — Courtney G McDonnough
(74) *Attorney, Agent, or Firm* — Morgan, Lewis & Bockius LLP

(57) ABSTRACT

A package comprises a body having a mounting surface so as to be mounted to an external surface, and a coil having at least 100 turns around a coil axis. A first end of the coil is oriented in a first direction substantially parallel to the mounting surface such that the first end is attachable to the external surface. The package includes a ferromagnetic element that extends along the coil axis such that the ferromagnetic element is magnetically coupled to the coil. The body is configured to house the coil and the ferromagnetic element.

20 Claims, 8 Drawing Sheets

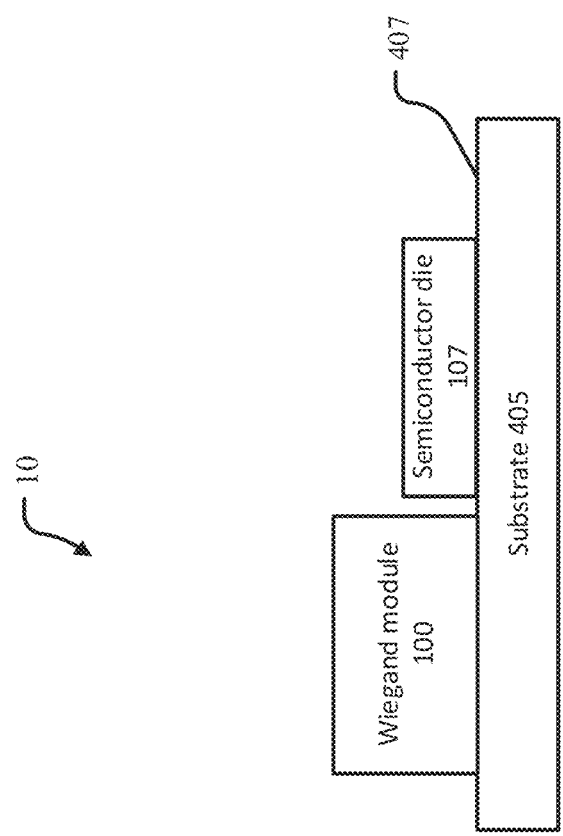

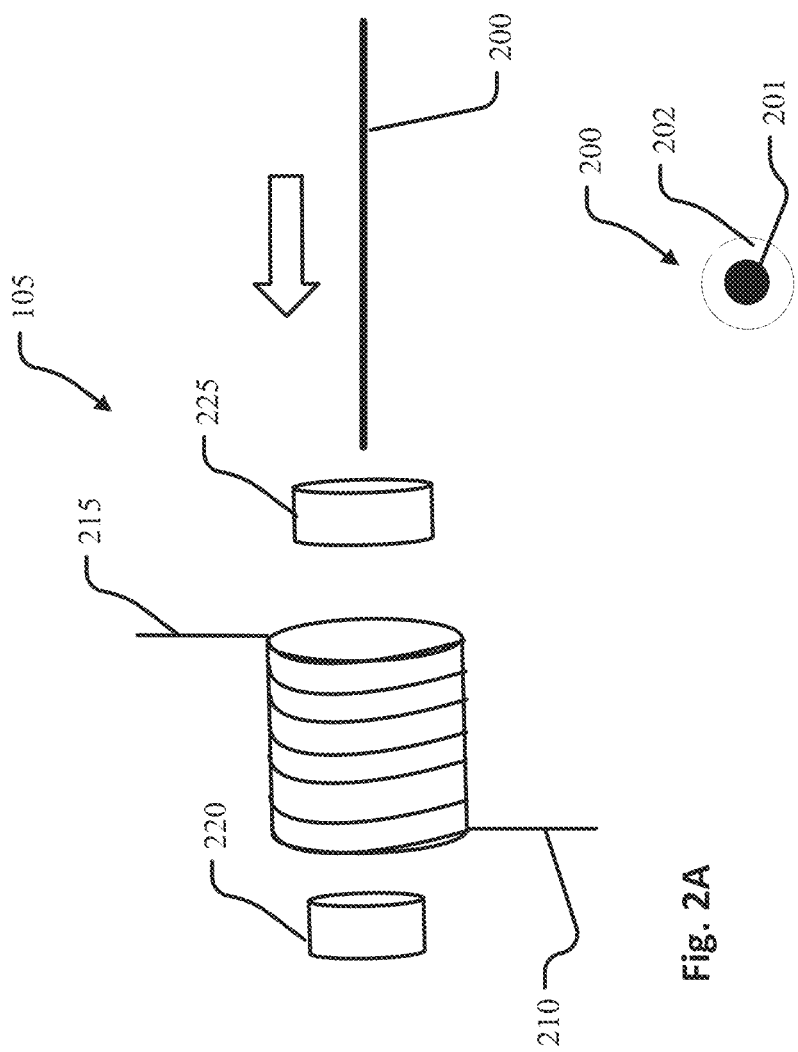

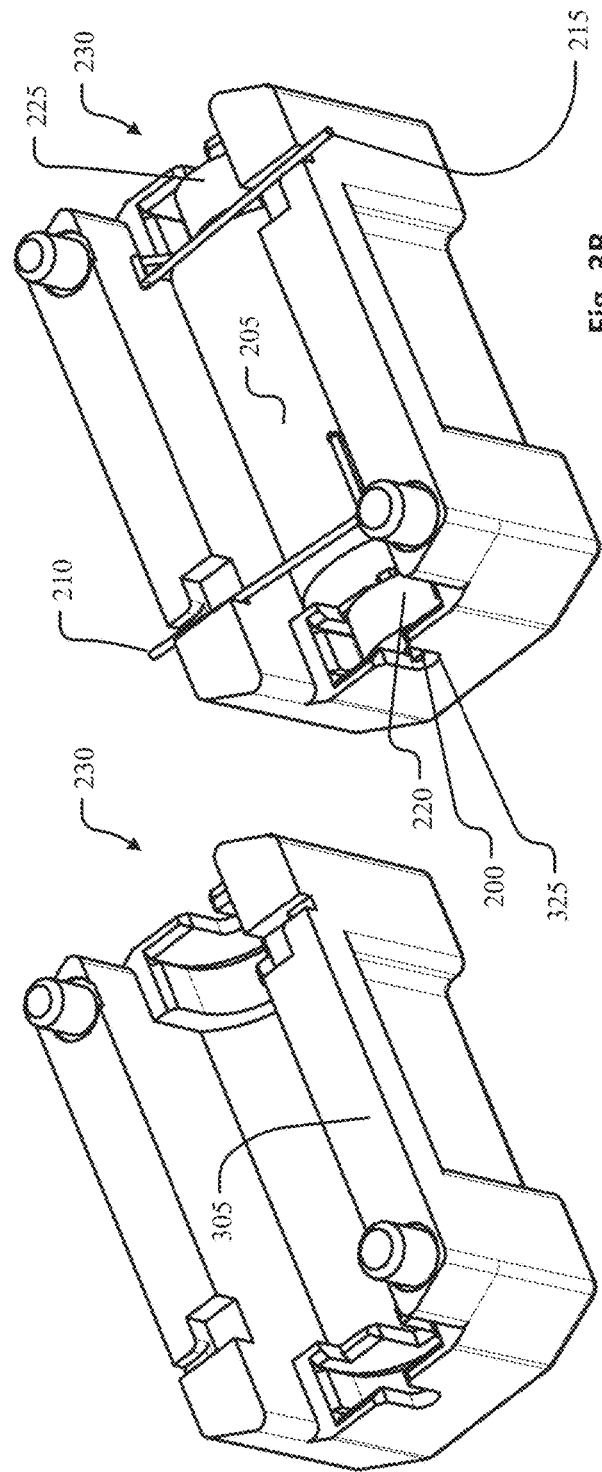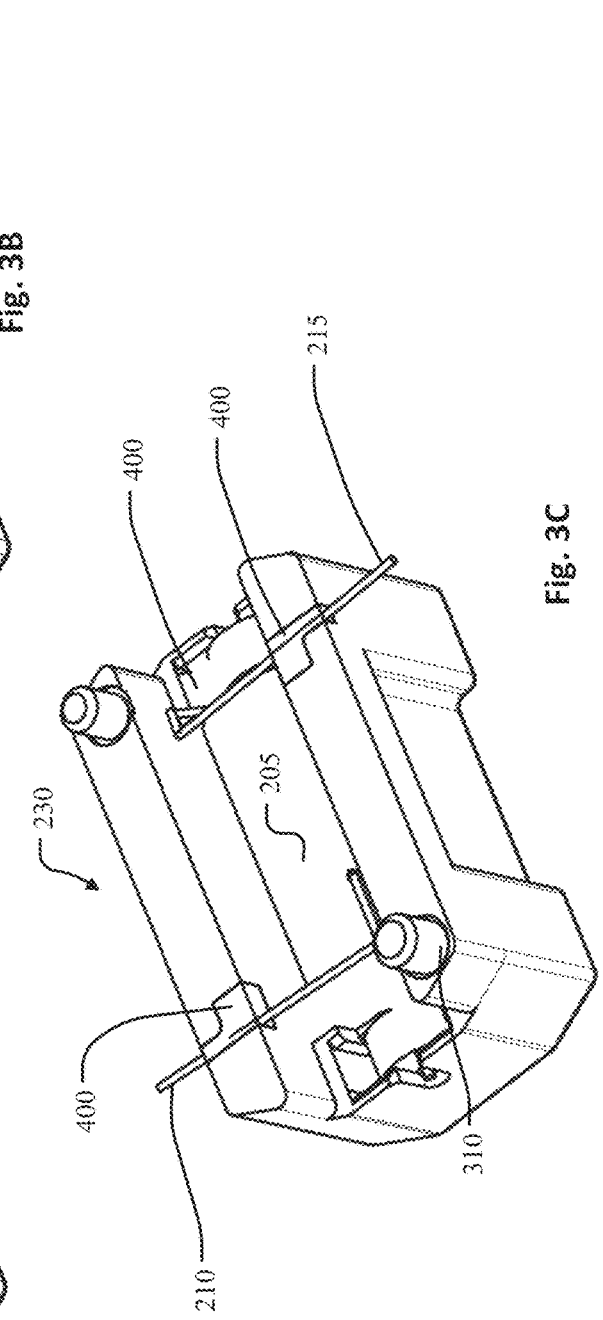

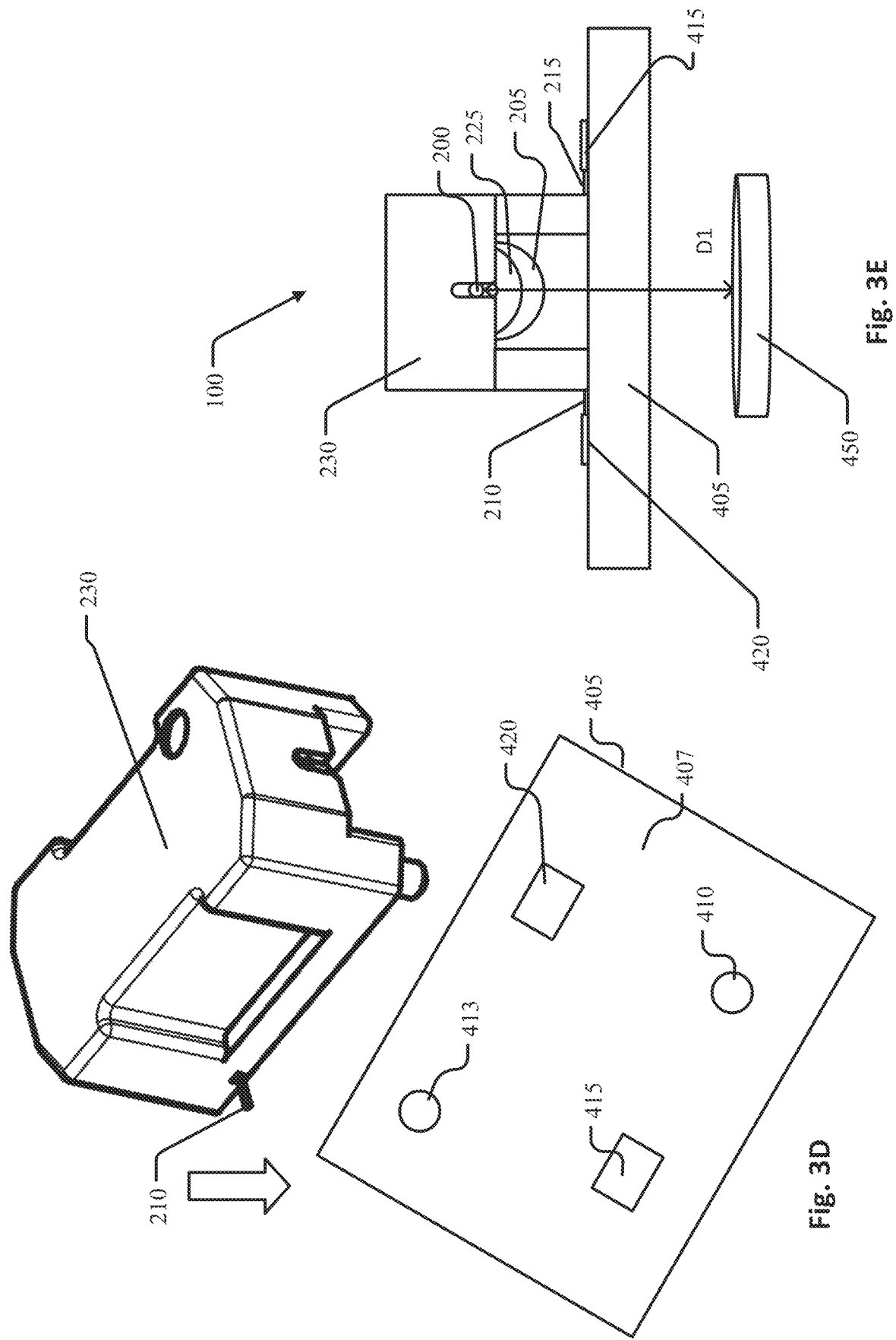

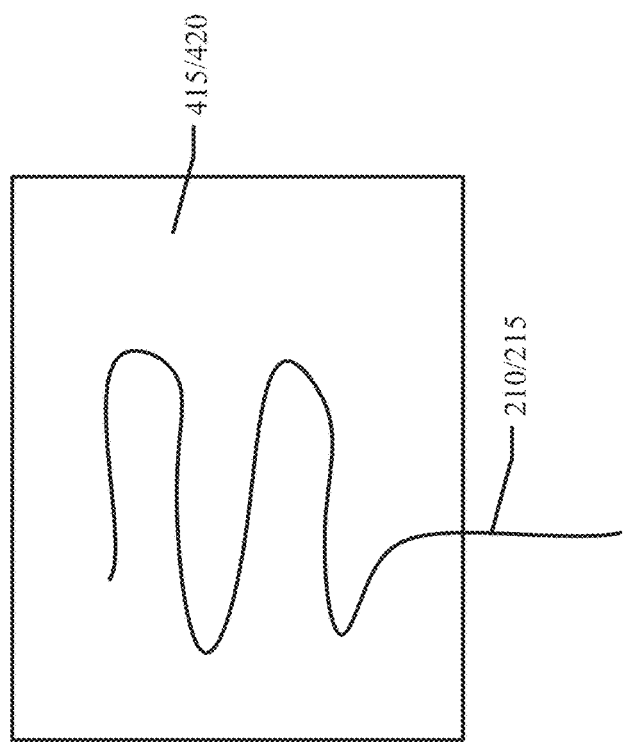
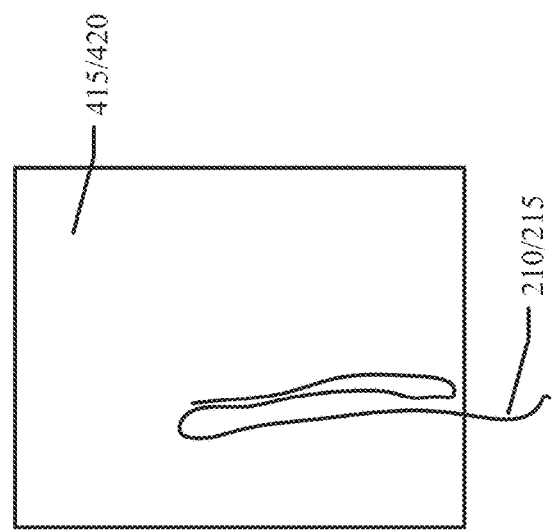
Fig. 4A
Fig. 4B

WIEGAND MODULE AND METHODS OF FORMING THE SAME

FIELD OF THE DISCLOSURE

Example embodiments are directed to sensor devices, Wiegand modules and methods of forming the same.

BACKGROUND

The Wiegand effect is a nonlinear magnetic effect caused by the presence of a magnetic field near a Wiegand wire. Applications that use the Wiegand effect include key-cards, rotatory encoders, speed sensors, etc. In the example of rotary encoders, a magnet rotated in proximity to the Wiegand module (which includes a Wiegand wire) causes the wire to produce a Wiegand effect, which is sensed by a pickup coil of the Wiegand module and output as an electrical signal to an external circuit(s) for further processing. Here, the structure of the Wiegand module and its connection to a substrate using leads may have unwanted effects on the electrical signal.

BRIEF DESCRIPTION OF THE DRAWINGS

The present disclosure is described in conjunction with the appended figures, which are not necessarily drawn to scale:

FIGS. 1A and 1B illustrate a system according to at least one example embodiment;

FIGS. 2A-2D illustrates various views of the Wiegand module in FIGS. 1A and 1B according to at least one example embodiment;

FIGS. 3A-3E illustrate an assembly of the Wiegand module of FIGS. 1A-1B and 2A-2D according to at least one example embodiment;

FIGS. 4A and 4B illustrate coil end structures of the coil from the Wiegand module of FIGS. 1-3E according to at least one example embodiment.

DETAILED DESCRIPTION

Figure 1B:
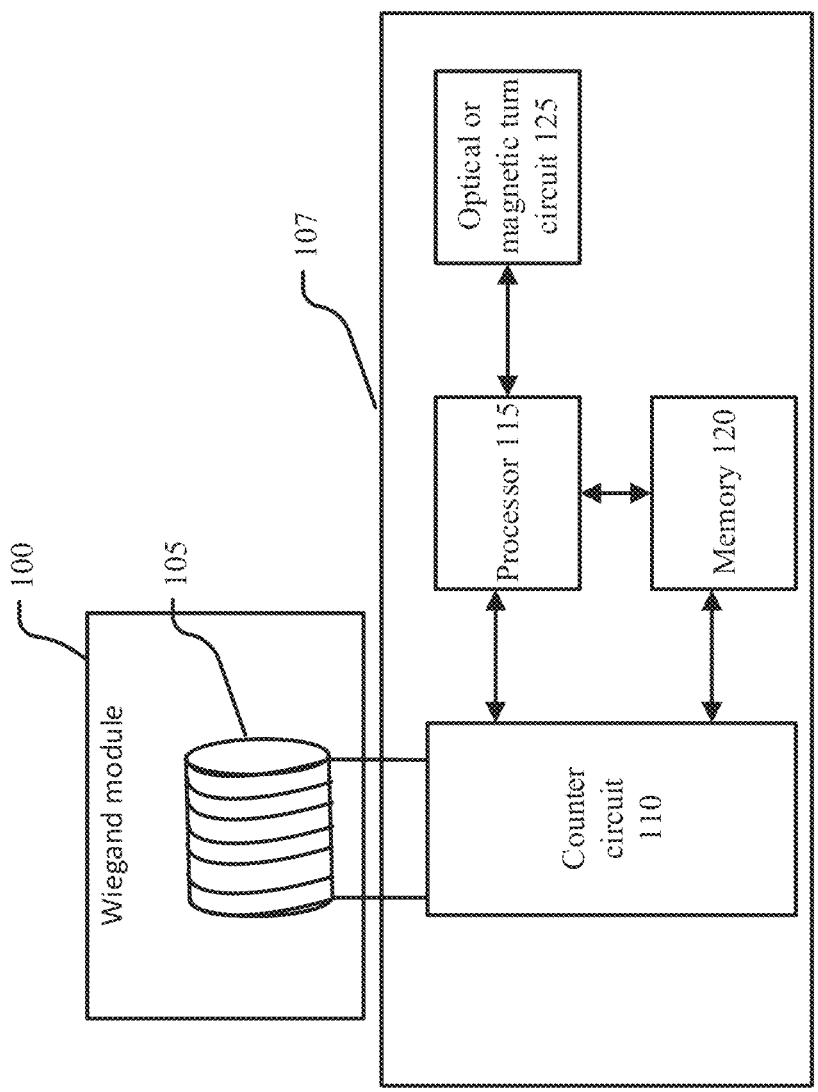

A multi-turn encoder is an electro-mechanical device used to monitor and measure the position, rotation velocity and/or acceleration of the shaft in an application over multiple revolutions. Multi-turn systems provide feedback on a number of shaft revolutions, and when combined with a single turn absolute encoder, the absolute position over multiple revolutions can be determined. One example of such an encoder includes a battery back-up system having an electronic counter and which relies on energy of the battery to store information of the shaft revolutions. However, these systems require periodically checking and replacing the battery.

Another example of a multi-turn encoder is a geared multi-turn system, which uses multiple disks connected by gears to track the revolution of shafts. Here, there is no battery to power up related electronics to actively store the information of shaft revolutions. However, the size of a geared system is usually relatively large and complicated with gear-train design. In addition, there is wear and tear of the components due to stress and friction with mechanical movement.

Yet another example of a multi-turn encoder is a Wiegand effect multi-turn system, which includes one or more magnets and magnetic wires with specific magnetic properties that exhibit the Wiegand effect by external designed magnetic excitation of the Wiegand wire. Here, the Wiegand wire exhibits a rapid magnetic polarity change when subjected to specific external magnetic field, and the rapid change of magnetic flux will generate a strong pulse of energy in a copper coil surrounding the Wiegand wire. The pulse energy is thus harvested with the coil, which triggers the revolution counter to process and write the position information to a non-volatile memory. The Wiegand effect multi-turn system is compact in size, mechanically reliable, does not use a battery, and does not require regular maintenance. In the Wiegand effect systems, there are magnetic elements (a two pole magnet, multi-pole magnets, a pair or multiple pairs of rectangle magnets, magnets in other shapes and configurations, etc.) whose direction and rate of change in the magnetic flux is correlated to the motion under detection. When the magnetic flux density (by the external magnetic elements) acted on the Wiegand wire exceeds a designed threshold, there will be a sudden flip of magnetic domain within the Wiegand wire, and the abrupt change of magnetic field will generate an electrical signal (e.g., a pulse voltage) in the coil surrounding the Wiegand wire. The energy from the pulse voltage is then utilized to operate circuitry, such as a counter Application Specific Integrated Circuit (ASIC) that assists with writing the data to the non-volatile memory.

Example embodiments of the present disclosure provide a leadless Wiegand module and system that may improve accuracy of the electric signal and reduce the complexity of system assembly.

Various aspects of the example embodiments will be described herein with reference to drawings that are schematic illustrations of idealized configurations. It should be appreciated that while particular circuit configurations and circuit elements are described herein, example embodiments are not limited to the illustrative circuit configurations and/or circuit elements depicted and described herein. Specifically, it should be appreciated that circuit elements of a particular type or function may be replaced with one or multiple other circuit elements to achieve a similar function without departing from the scope of example embodiments. Moreover, it should be understood that some or all elements of one example embodiment may be applied to one or more other example embodiments if desired.

FIG. 1A illustrates a system 10 according to at least one example embodiment. As shown in FIG. 1A, the system 10 includes a Wiegand module (or package) 100, a semiconductor die 107, and a substrate 405 (e.g., a printed circuit board (PCB) or other suitable substrate). According to at least one example embodiment, the Wiegand module 100 and the semiconductor die 107 are mounted to an external surface 407 the substrate 405. However, it should be understood that example embodiments are not limited thereto. For example, the semiconductor 107 may be mounted on a different surface of the substrate 405 than external surface 407 or on a different substrate than substrate 405.

FIG. 1B illustrates the Wiegand module 100 and the semiconductor die 107 of FIG. 1A in more detail. As shown, the Wiegand module 100 includes a core structure 105, and the semiconductor die 107 includes a counter circuit 110, a processor 115, a memory 120, and turn circuit 125. The Wiegand module 100 and core structure 105 will be described in more detail below with reference to FIGS. 2A-5, but the core structure 105 should be understood to generally include a Wiegand wire magnetically coupled to a coil (e.g., a pickup coil). As shown in FIG. 1B, the Wiegand module 100 is electrically connected to the counter circuit 110. For example, two ends of the coil of the core structure 105 are electrically connected to the counter circuit 110.

The counter circuit 110 may be any circuit (e.g., an ASIC) capable of using the pulses from the coil of the core structure 105 as energy for operating the circuit 110 and writing data to the memory 120. For example, the counter circuit 110 may include circuitry for sensing and/or counting pulses received from the Wiegand module 100, such as a pulse detector and/or a current detector. As such, the counter circuit 110 may include one or more operational amplifiers, comparators, or the like to detect an electrical pulse (e.g., a Wiegand signal) received from the Wiegand module 110.

As shown, the counter circuit 110 is coupled to the processor 115 and the memory 120 over, for example, a suitable communications bus. The processor 115 is coupled to the memory 120 and the turn circuit 125, which may be an optical turn circuit or a magnetic turn circuit. In any event, the counter circuit 110, the processor 115, the memory 120 and/or the turn circuit 125 may be included on a semiconductor die 107 that is electrically coupled to the coil of the Wiegand module 100 so that the semiconductor die 107 is configured to process an electrical signal generated from the coil when an external magnetic field is applied to at least one of the coil and the Wiegand wire (or ferromagnetic element). The semiconductor die 107 may also include a Hall sensor, a current detector, and/or a pulse detector (e.g., if not already included in the counter circuit 110). As will be discussed in further detail herein, the connection between the Wiegand module 100 and semiconductor die 107 may include at least two electrical connection points, but the electrical connections may be made without the need for separate electrical leads or wires.

The processor 115 may include any type of hardware and/or software for processing signals of the system 10. For example, the processor 115 may include a microprocessor with an associated memory including instructions that are executable by the microprocessor. The processor may include an ASIC or other circuitry for processing signals of the system 100. The processor 115 as described herein may perform computational functions using any known or future-developed standard, instruction set, libraries, and/or architecture.

The memory 120 may be volatile and/or non-volatile in nature. For example, the memory 120 may be random access memory (RAM), read-only memory (ROM), dynamic RAM (DRAM), solid-state disk (SSD), and/or other storage device(s) and media.

The turn circuit 125 may be a circuit used within an application being monitored by the Wiegand module 100. For instance, the circuit 125 may include logic that facilitates the production of alerts, messages, or the like in response to the Wiegand module 100 detecting a predetermined number of rotations, turns, partial turns, etc. The circuit 125 may be connected to additional external circuitry operating other aspects of a motor control system or the like.

Figure 2D:
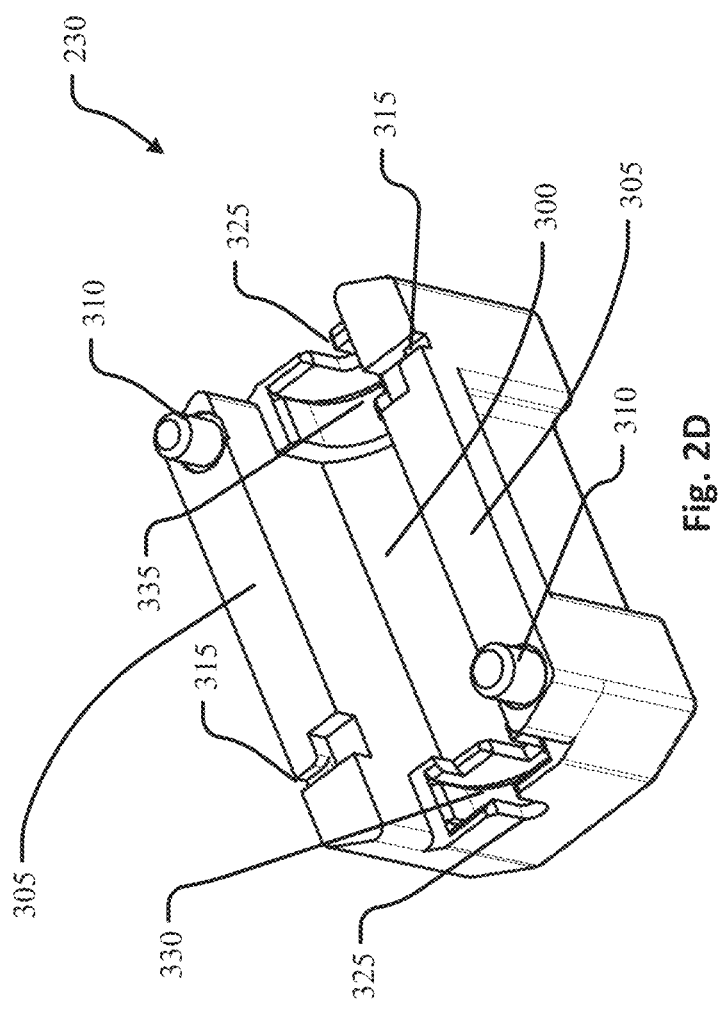

FIGS. 2A-D illustrate various views of the Wiegand module 100 in FIGS. 1A and 1B. As shown in FIG. 2A, the Wiegand module 100 includes the core structure 105 and a body 230 configured to house the core structure 105. As shown in FIG. 2A, the core structure 105 includes a ferromagnetic element 200, a coil 205, coil ends 210/215, and cylindrical ferrites 220/225. The ferromagnetic element 200 may comprise a Wiegand wire formed so as to exhibit a Wiegand effect. When fully assembled, the Wiegand wire 200 is inserted into the coil 205 and the ferrites 220/255. In at least one example embodiment, the coil 205 has at least 100 turns around a coil axis. The coil 205 has a center looping portion that turns around the coil axis that is substantially parallel to the external surface 407 on which the Wiegand module 100 is mountable. As noted above, the external surface 407 may be a surface of a substrate 405, which may be a PCB or other suitable mountable surface (see, for example, FIGS. 3A-3E). According to at least one example embodiment, the center looping portion of the coil 205 turns around the coil axis at least 100 times per millimeter such that when an external magnetic field is applied thereto, an electrical current is generated.

As shown in FIG. 2B, the coil 205 comprises a center conductive portion 201 and an insulation portion 202 covering the center conductive portion 210 such that the coil 205 is electrically insulated but exposed at the first end 210 and the second end 215 so as to establish the first and second electrical connections to the external surface 407 (e.g., with contact pads of the external surface 407, as shown in FIGS. 3D and 3E). The center conductive portion 201 may be comprised of copper.

Figure 2C:
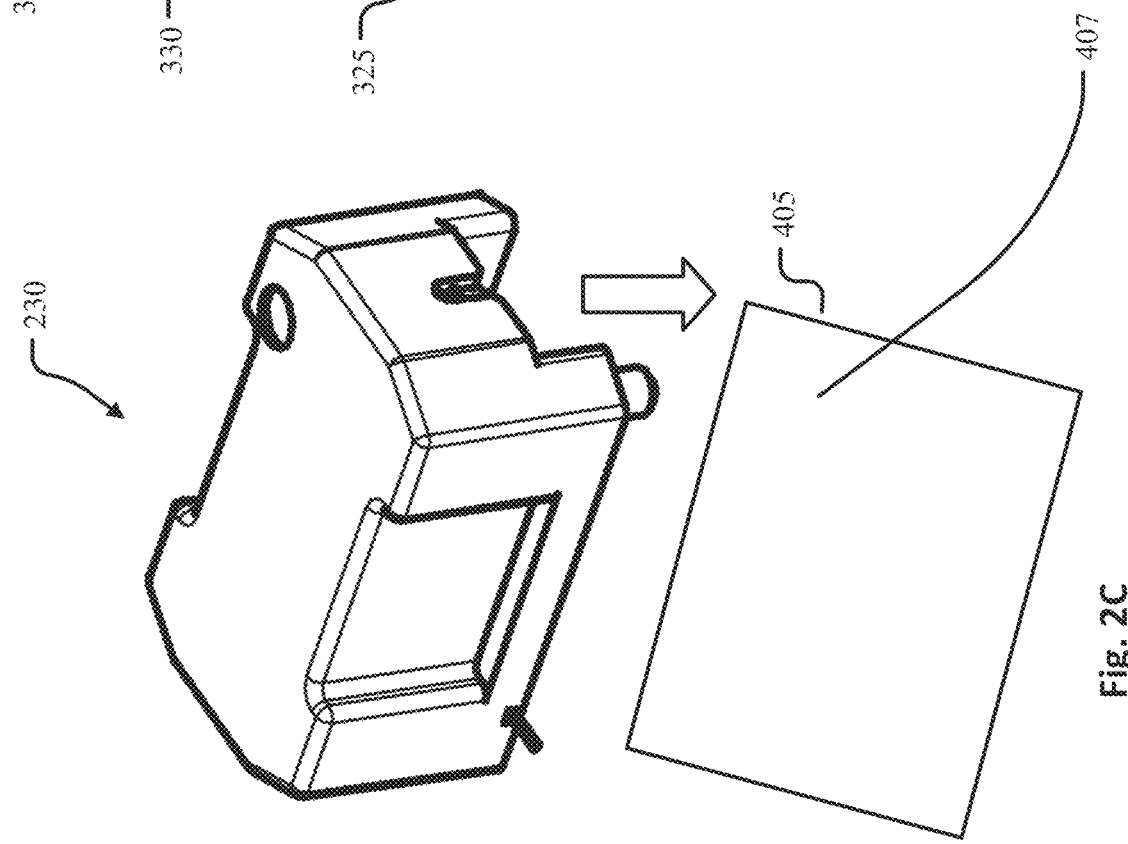

FIGS. 2C and 2D illustrate top and bottom perspective views of the body 230, respectively. The body 230 is configured to house the coil 205 and the ferromagnetic element 200. As shown in the top perspective view in FIG. 2C, the body 230 is mountable to the external surface 407 of the substrate 405. As shown in the bottom perspective view of FIG. 2D, the body 230 includes a cavity 300 with one or more ferrite cavities 330/335, a mounting surface 305, at least one connection structure (or guiding structure) 310, at least one recess 315 in the mounting surface 305, and one or more grooves 325.

According to at least one example embodiment, the cavity 300 accommodates the core structure 105. For example, the cavity 300 includes a center portion that accommodates the coil 205 and end portions that include ferrite cavities 330/335 for accommodating the ferrites 220/225.

As shown, the body 230 has the mounting surface 205 so as to be mounted to the external surface 407. That is, the mounting surface 305 is a surface of the body 230 that contacts the external surface 407 when the body 230 is mounted to the external surface 407. The mounting surface 305 of the body 230 comprises a substantially flat portion so as to engage the external surface 407.

The at least one connection structure (or guiding structure) 310 is on the mounting surface 305 and secures the body 230 to the external surface 407. FIG. 2D illustrates an example where the at least one connection structure 310 includes two connection structures 310 at opposing corners of the body 230. As shown, the connection structures 310 are male connection structures that protrude from the mounting surface 305 for engagement with corresponding female connection structures on the external surface 407 (see, e.g., FIGS. 3A-3E). The connection structures 310 may extend in a second direction that is orthogonal to the external surface for engagement with the external surface 407. The engagement with the external surface 407 may be via a snap-fit connection, friction force connection, adhesive connection, and/or the like. That is, the connection structure 310 extends outwardly from the mounting surface 305 for engaging a receiving structure disposed on the external surface 407. Here, it should be understood that example embodiments are not limited to the connection structures 310 shown in FIG. 2D, and the connection structures 310 may vary in number, size, shape, type of connection (e.g., female instead of male), location, etc. according to design preferences. For example, instead of the connection structures 310 extending out of the mounting surface 305, the connection structures 310 may extend into the mounting surface (e.g., as holes or openings) for engaging a mating structure (e.g., a structure similar to or the same as the illustrated protruding connection structures 310) protruding from the external surface 407.

The at least one recess (or trench, or opening) 315 is in the mounting surface 305. The at least one recess 315 allows for an end portion(s) 210/215 of the coil 205 to exit (or pass through) the body 230 when the body 230 is engaging the external surface 407 for connection of the end portion(s) 210/215 to the external surface 407. In other words, the mounting surface 305 of the body 230 comprises a trench 315 configured to allow a portion of the coil 205 to pass through. FIG. 2D shows an example that includes two recesses 315, one recess for each end 210/215 of the coil 205. The recesses 315 are located in the mounting surface 305 at opposing corners of the body 230. Here, the opposing corners of the body 230 that include the recesses are different than the opposing corners of the body 230 that include the connection structures 310. The depth and width of the recesses 315 should be such that each end 210/215 of the coil 205 fits into one of the recesses 315 in a manner that allows the mounting surface 305 to be flush with the external surface 407 upon mounting of the body 230 to the external surface 407. However, example embodiments are not limited to the recesses 315 shown in FIG. 2D, and the recesses 315 may vary in number, size, shape, location, etc. according to design preferences.

The one or more grooves 325 accommodate the wire 200 when the package is assembled. FIG. 2D shows an example that includes two grooves 325, one at each end of the body 230. As shown, each groove 325 is formed in a sidewall of the body 230 that is spaced apart from the mounting surface 305. For example, during assembly, the core structure 105 is placed into the cavity 300 of the body 230 so that ends of the wire 200 protrude from the ferrites 220/225 and rest in the grooves 325.

The assembly of the package 100 and mounting thereof to the external surface 407 is discussed in more detail below with reference to FIGS. 3A-3E, 4, and 5.

FIGS. 3A-3E illustrate a method of assembling the Wiegand module 100 in FIGS. 1A-2D according to at least one example embodiment.

FIG. 3A illustrates a first stage of assembly where the body 230 is placed on a surface with the mounting surface 305 facing upward.

FIG. 3B illustrates a second stage of assembly where the core structure 105 is placed into the cavity 300 of the body 230. As shown, the coil 205 sits in a main portion of the cavity 300 while the ferrites 220/255 sits in respective ferrite cavities 320. As noted above, the wire 200 is inserted through the coil 205 and the ferrites 220/225 so that ends of the wire 200 sit in the grooves 320 of the body 230. As shown, ends 210/215 of the coil 205 are arranged in the body 230 so as to protrude from the recesses 315 of the body 230. As also noted above, the wire (or ferromagnetic element) 200 extends along the coil axis such that the wire 200 is magnetically coupled to the coil 205.

FIG. 3C illustrates a third stage of assembly where the core structure 105 is secured/protected in the cavity 300 by a potting material 400, such as glue, polymer, or other suitable material. In the example shown in FIG. 3C, the potting material 400 fills empty gaps within the cavity 300 but does not necessarily completely cover the ferrites 220/225 and/or the central part of the coil 205. As also shown, the potting material 400 secures the ends 210/215 of the coil 205 by filling the recesses 315. Here, it should be understood that the potting material 400 and the mounting surface 305 are coplanar so as to allow the body 230 to be flush against the external surface 407.

FIG. 3D illustrates a fourth stage of assembly where the body 230 (now including the secured core structure 105) is mounted to a substrate 405. Here, the mounting surface 305 contacts the external surface 407 of the substrate 405. The substrate 405 may include one or more connection structures 410 for mating with corresponding connection structures 310. In the example of FIG. 3D, two connection structures 410/413 are shown as openings or holes in the substrate 405 for receiving the protruding connections structures 310 of the body 230. The substrate 405 may also include first and second conductive contact pads 415 and 420 for making electrical contact with respective coil ends 210/215. According to at least one example embodiment, the coil ends 210/215 are bonded to respective contact pads 415/420 by any known bonding method, such as soldering, Cu—Cu bonding, etc. The contact pads 415/420 may be coupled to other circuits, such as the counter circuit 110, the processor 115, the memory 120, and/or the turn circuit 125 of FIG. 1B.

FIG. 3E illustrates cross-sectional view of a fifth stage of assembly in which the assembled Wiegand module 100 is brought (e.g., mounted) within a desired distance D1 of a rotary magnet 450 if, for example, the desired application is a rotary encoder. As one may appreciate, the direct connection of the coil ends 210/215 to the contact pads 415/420 reduces the overall footprint of the Wiegand module compared to applications that use modules having leads that raise the module further above the substrate 400.

In view of the above, it should be understood that the first end 210 of the coil 205 is oriented in a first direction substantially parallel to the mounting surface 305 such that the first end 215 is attachable to the external surface 407. Similarly, the second end 215 of the coil 205 is oriented in the first direction such that the second end 215 is attachable to the external surface 407. According to at least one example embodiment, the first end 210 and the second end 215 include strengthening portions, shown in more detail below with reference to FIG. 4.

FIGS. 4A and 4B illustrate examples of strengthening portions for the coil ends 210/215 in FIGS. 2A-3E. As shown in FIGS. 4A and 4B, the coil ends 210/215 may include strengthening portions configured to be directly attached to the external surface 407 (e.g., directly attached to the contact pads 415/420). For example, as shown in FIG. 4A, the strengthening portions comprise a plurality of winding portions of the coil ends 210/215, and the plurality of winding portions extend parallel to the external surface 407 and contact pads 415/420. According to at least one example embodiment, the plurality of winding portions extend longitudinally in a first direction. As shown in FIG. 4B, the strengthening portion comprises a folded portion of the coil ends 210/215. For example, the strengthening portion comprises a portion of the conductive wire 200 that is folded more than one time to strengthen the first end 210 and/or the second end 215 of the coil 205. In FIG. 4B, it should be appreciated that the space between folded portions of the coil ends 210/215 may be less than the space between each winding portion in FIG. 4A. In view of the above, it may be said that the winding portions/folded portions may enhance electrical connection between the ends of the coil 210/215 and the contact pads 415/420 pad.

Here, it should be understood that example embodiments are not limited to the number and/or orientation of winding portions and folds shown in FIGS. 4A and 4B, and that fewer or more winding portions/folds in different orientations could be included according to design preferences.

In view of the above, it should be understood that example embodiments are directed to a sensing device comprising a substrate 405 having at least a first contact pad 415 and a second contact pad 420. The sensing device includes a coil 205 having a center looping portion and an end portion 210/215. Here, the center looping portion turns around a coil axis that is substantially parallel to the substrate 405, and the end portion 210/215 is oriented in a first direction substantially parallel to the substrate 405. The sensing device includes a ferromagnetic element 200 that extends along the coil axis such that the ferromagnetic element 200 is magnetically coupled to the coil 205. The sensing device includes a housing (or body) 230 on the substrate 405 and supporting the coil 205 such that the coil axis is substantially parallel to but distanced away from the substrate 405 (e.g., by a desired distance D1). The end portion of the coil comprises a first end 210 and a second end 215 that are attached directly to the first contact pad 415 and the second contact pad 420, respectively, to establish a first electrical connection between the first end 210 and the first contact pad 415 and a second electrical connection between the second end 215 and the second contact pad 420.

Figure 5:
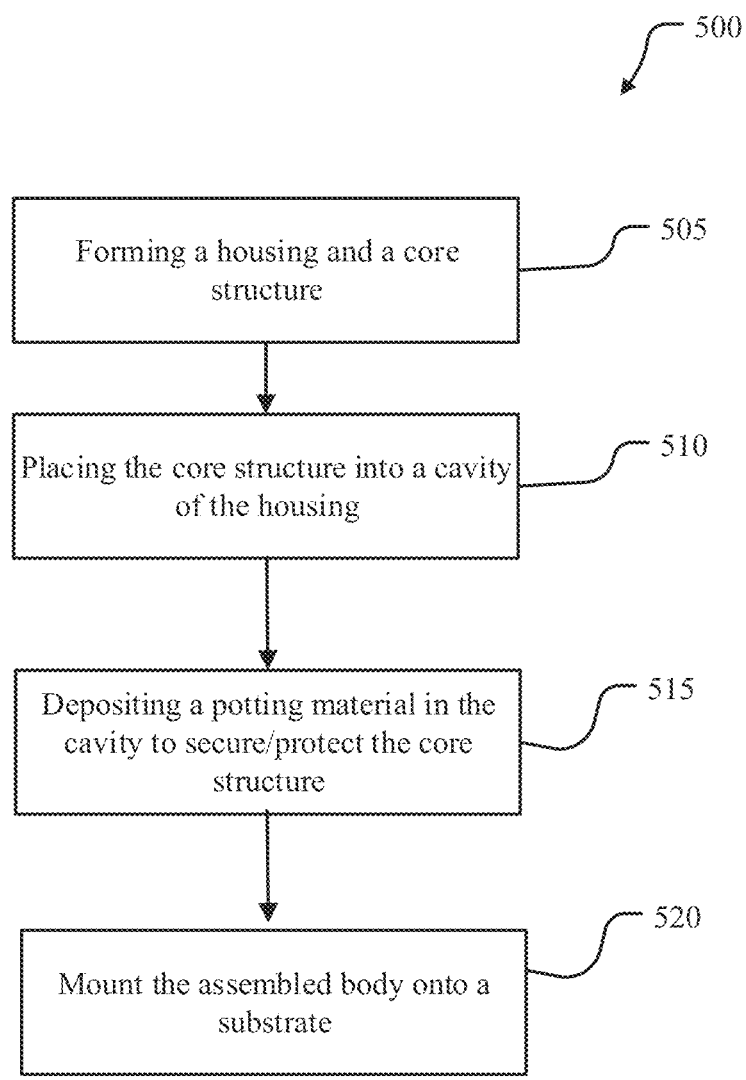
FIG. 5 illustrates example operations for assembling the Wiegand module of FIGS. 1A-4B according to at least one example embodiment.

FIG. 5 illustrates example operations for assembling the Wiegand module 100 described with respect to FIGS. 1A-4B. While a general order for the steps of the method is shown in FIG. 6, the method 500 can include more or fewer steps or can arrange the order of the steps differently than those shown in FIG. 5. Generally, the method 500 starts at operation 505 and ends at operation 520. Hereinafter, FIG. 5 shall be explained with reference to the systems, components, assemblies, devices, user interfaces, environments, software, etc. described in conjunction with FIGS. 1A-4B.

In operation 505, the method 500 includes forming a housing/body 230 and a core structure 105. In operation 510, the method 500 includes placing the core structure 105 into a cavity 300 of the housing 230. In operation 515, the method 500 includes depositing a potting material in the cavity 300 to secure and/or protect the core structure. The potting material may be a polymer or other suitable material. In operation 520, the method 500 includes mounting the assembled body 230 (now including the secured core structure 105) on a substrate 405.

It should be appreciated that FIGS. 1A-5 have been described using terms such as first, second, third, etc., but that these terms are used for the convenience of explanation and do not limit example embodiments. For example, a particular element (e.g., a circuit, a signal, structure, etc.) may be modified by the term "first" in one section of the description, but the same element may have a different modifier (e.g., "second") in another section of the description without limitation.

In view of the foregoing description, it should be understood that example embodiments are directed to packages, sensing devices, and/or methods of forming packages and/or sensing devices that may improve the quality of transmission for an electrical signal generated by a Wiegand module and/or simplify assembly of a Wiegand module by eliminating the need for leads to connect the pickup coil of the Wiegand module with a substrate.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A package comprising:
   a body having a mounting surface so as to be mounted to an external surface;
   at least one connection structure on the mounting surface that is configured to secure the body to the external surface, wherein the connection structure secures the body to the external surface using a particular connection;
   a coil having a plurality of turns around a coil axis;
   a first end of the coil being oriented in a first direction substantially parallel to the mounting surface such that the first end is attachable to the external surface, wherein the first end of the coil comprises a strengthening portion configured to be directly attached to the external surface; and
   a ferromagnetic element that extends along the coil axis such that the ferromagnetic element is magnetically coupled to the coil,
   wherein the body is configured to house the coil and the ferromagnetic element and the body is configured to support the coil such that the coil axis is substantially parallel to, and distanced away from, the external surface.

2. The package of claim 1, wherein the coil further comprises a second end, the second end of the coil being oriented in the first direction such that the second end is attachable to the external surface.

3. The package of claim 1, wherein the ferromagnetic element comprises a Wiegand wire.

4. The package of claim 1, wherein the plurality of turns comprises at least 100 turns.

5. The package of claim 1, wherein the coil comprises a conductive wire which loops around the coil axis, and wherein the strengthening portion comprises a folded portion of the conductive wire.

6. The package of claim 5, wherein the strengthening portion comprises a plurality of winding portions of the conductive wire, and wherein the plurality of winding portions extend longitudinally in the first direction.

7. The package of claim 5, wherein the strengthening portion comprises a portion of the conductive wire that is folded more than one time to strengthen the first end of the coil.

8. The package of claim 1, wherein the mounting surface of the body comprises a substantially flat portion so as to engage the external surface, and wherein the body comprises at least one opening allowing the first end of the coil to pass through when the mounting surface of the body is engaging the external surface.

9. The package of claim 1, wherein the mounting surface of the body comprises a trench that is configured to allow a portion of the coil to pass through.

10. The package of claim 1, wherein the coil comprises a copper coil.

11. The package of claim 1, wherein the at least one connection structure extends in a second direction orthogonal to the first direction.

12. The package of claim 11, wherein the at least one connection structure extends into the mounting surface for engaging a mating structure protruding from the external surface.

13. The package of claim 11, wherein the at least one connection structure extends outwardly from the mounting surface for engaging a receiving structure disposed on the external surface.

14. A sensing device comprising:
a body having a mounting surface so as to be mounted to a substrate having at least a first contact pad and a second contact pad;
at least one connection structure on the mounting surface that secures the body to the substrate, wherein the connection structure secures the body to the substrate using a particular connection;
a coil having a center looping portion and an end portion, wherein the center looping portion turns around a coil axis that is substantially parallel to the substrate, and wherein the end portion is oriented in a first direction substantially parallel to the substrate;
a ferromagnetic element that extends along the coil axis such that the ferromagnetic element is magnetically coupled to the coil; and
a housing on the substrate and supporting the coil such that the coil axis is substantially parallel to but distanced away from the substrate, wherein the coil comprises a center conductive portion, wherein the end portion of the coil comprises a first end and a second end, and wherein the center conductive portion of the coil at the first end comprises a first strengthening portion to be directly attached to the first contact pad and the second end comprises a second strengthening portion to be directly attached to the second contact pad to establish a first electrical connection between the first end and the first contact pad and a second electrical connection between the second end and the second contact pad.

15. The sensing device of claim 14, further comprising:
a semiconductor die electrically coupled to the coil, the semiconductor die being configured to process an electrical signal generated from the coil when an external magnetic field is applied to at least one of the coil and the ferromagnetic element, wherein the semiconductor die comprises at least one of a counter, a Hall sensor, a non-volatile memory, a microprocessor, a current detector, and a pulse detector.

16. The sensing device of claim 14, wherein the center looping portion turns around the coil axis at least 100 times per millimeter such that when an external magnetic field is applied thereto, an electrical current is generated.

17. The sensing device of claim 14, wherein the coil comprises an insulation portion covering the center conductive portion such that the coil is electrically insulated but exposed at the first end and the second end so as to establish the first and second electrical connections with the first contact pad and the second contact pad.

18. The sensing device of claim 14, wherein the center conductive portion of the coil at the first end is folded more than one time on the first contact pad so as to enhance electrical connection between the first end of the coil and the first contact pad.

19. The sensing device of claim 14, wherein the center conductive portion of the coil at the first end comprises a winding portion disposed on the first contact pad so as to enhance electrical connection between the first end of the coil and the first contact pad.

20. A package comprising:
a body having a mounting surface so as to be mounted to an external surface;
at least one connection structure on the mounting surface that is configured to secure the body to the external surface, wherein the connection structure secures the body to the external surface using a particular connection;
a coil having a plurality of turns around a coil axis,
a first end of the coil being oriented in a first direction substantially parallel to the mounting surface such that the first end is attachable to the external surface, wherein the first end of the coil comprises a strengthening portion configured to be directly attached to the external surface;
at least one recess in the mounting surface that allows for the first end of the coil to exit the body for connection of the first end to the external surface; and
a ferromagnetic element that extends along the coil axis such that the ferromagnetic element is magnetically coupled to the coil,
wherein the body is configured to house the coil and the ferromagnetic element and the body is configured to support the coil such that the coil axis is substantially parallel to, and distanced away from, the external surface.

* * * * *